United States Patent [19]
Waltz

[11] 4,210,948
[45] Jul. 1, 1980

[54] METHOD AND APPARATUS FOR MONITORING LINE VOLTAGE IN A POLYPHASE SOURCE

[75] Inventor: Richard W. Waltz, Milwaukee, Wis.

[73] Assignee: Allen-Bradley Company, Milwaukee, Wis.

[21] Appl. No.: 915,898

[22] Filed: Jun. 15, 1978

[51] Int. Cl.² .............................................. H02H 3/32
[52] U.S. Cl. ....................................... 361/76; 324/86; 361/85
[58] Field of Search ............... 361/76, 77, 85; 324/86, 324/83 A; 340/658; 307/127

[56] References Cited

U.S. PATENT DOCUMENTS

| | | |
|---|---|---|
| 3,736,470 | 5/1973 | Ford et al. |
| 3,743,889 | 7/1973 | Lopez-Batiz |
| 3,848,160 | 11/1974 | Boothman et al. |
| 3,875,463 | 4/1975 | Reuter et al. |
| 3,938,006 | 2/1976 | Gadwal et al. |
| 3,947,728 | 3/1976 | Smith ...................................... 361/76 |
| 4,023,075 | 5/1977 | Reuter |

OTHER PUBLICATIONS

"Generator Protection with a New Static Negative Sequence Relay" IEEE Transactions on Power Apparatus and Systems, vol. PAS-94, No. 4, pp. 1208–1213, Jul./Aug. 1975.
"A Negative Sequence Voltage Relay", Hatch Inc. Tech. paper–62874–Kersting.
"Alternating-Current Circuits", Kerchner & Corcoran, 4th Ed., John Wiley & Sons, Inc., 1962, pp. 489–496.

Primary Examiner—Harry E. Moose, Jr.
Attorney, Agent, or Firm—Quarles & Brady

[57] ABSTRACT

A method of monitoring open phase, phase reversal and voltage unbalance conditions in a polyphase source includes shifting the phase of signals which are proportional to the line voltages in a three-phase A.C. power source by 180°, +60°, and −60°, respectively, and summing the phase-shifted signals to generate a signal which is proportional to the negative-sequence component of the three-phase line voltage. This signal is rectified and compared with a reference signal. If a net negative-sequence signal is generated over a sufficient time period a positive output signal decreases until it crosses a switching threshold to disconnect a load from the source. The output signal will not rise again to the switching threshold, thereby allowing reconnection of the load, until the negative-sequence signal subsides and is less than the reference signal. A circuit is disclosed with three operational amplifiers and two passive filters to carry out the invented method.

5 Claims, 9 Drawing Figures

017# METHOD AND APPARATUS FOR MONITORING LINE VOLTAGE IN A POLYPHASE SOURCE

BACKGROUND OF THE INVENTION

1. Field of the Invention

The invention relates to methods and apparatus for sensing open phase, phase reversal, and voltage unbalance conditions in a polyphase source which supplies power to a polyphase load.

2. Description of the Prior Art

Polyphase electrical equipment is designed to operate on a balanced polyphase supply voltage. A balanced three-phase voltage is one in which the three phases are equal in magnitude, in proper phase sequence, and displaced from each other by 120°. Open phase and phase reversals result in severe voltage unbalance between the phases of a polyphase source. These faults have long been detectable with various types of protection devices.

A condition which is much harder to detect, and which also poses a threat to electrical equipment, is moderate voltage unbalance between the phases of a polyphase source. This condition occurs in a three-phase source when all phases are present and in proper sequence, but differ in magnitude, or differ in phase by an angle other than 120°. This condition, if not detected and controlled, can result in damage to electrical equipment, especially to electrical motors. Overload relays, which provide protection against large currents in electrical motors, may not be tripped by moderately unbalanced voltages, which can cause hot spots in the rotor of a three-phase induction motor.

A number of devices are known for detecting open phase, phase reversal and voltage unbalance conditions in a polyphase source and interrupting its connection to a load. These devices operate according to the theory of symmetrical components, which is well known to those skilled in the art. The theory of symmetrical components provides that any unbalanced polyphase system of vectors can be resolved by mathematical analysis into a balanced system of positive-sequence components, a balanced system of negative-sequence components and a unitary system of zero-sequence components having the same phase and magnitude.

Voltage unbalance can be determined from these components as follows:

% Voltage unbalance = $([V_2]/[V_1]) \times 100\%$ where:

[$V_2$] = the magnitude of a negative-sequence component derived from a three-phase voltage, and

[$V_1$] = the magnitude of a positive-sequence component derived from the same three-phase voltage.

Because the magnitude of the components within either the positive- or negative-sequence system are the same, any one of the components from each system may be used for $V_1$ and $V_2$, respectively. When a three-phase voltage is balanced the magnitude of any of the negative-sequence components is zero, and the positive-sequence components equal the single-phase voltages. As the percentage of unbalance increases, the magnitudes of the negative-sequence components increase while the magnitudes of the positive-sequence components decrease. The magnitudes of the negative-sequence components have been found to be related to the heating that occurs in the rotor of an induction motor under unbalanced conditions. In view of this relationship, one of the negative-sequence components may be compared with some fixed reference, such as line voltage, instead of a positive-sequence component in judging the potential harm of voltage unbalance.

The negative-sequence components can be obtained mathematically by multiplying vectors representing the line voltages or line currents by a phase shift operator. Certain line voltages or line currents are shifted by a phase angle of 120°, while others are shifted by a phase angle of 240° (which is equivalent to a phase shift of −120°). After the appropriate phase shifts are made, the respective line voltages or line currents are summed to produce the negative-sequence components.

Phase shifts can be obtained with electronic components. For example, a transistor connected in a common-emitter configuration has an output voltage between its collector and emitter which is displaced 180° from an input voltage applied between its base and its emitter. Phase shifts can also be obtained with passive components such as resistors and capacitors, but it is easier to obtain phase shifts between 0° and ±90° with passive components. Phase-shifting networks can be cascaded to obtain phase shifts greater than ±90°, but this is undesirable if it can be avoided.

In the application of the theory to electrical circuits, it has not always been practical or desirable to duplicate the phase shifts of the theory. Thus, the prior art devices provide several different ways to obtain a negative-sequence component. The manner in which the negative-sequence component is detected, the type of circuit response to the detected component, and the choice between monitoring line voltage and monitoring line current, have significant consequences upon the usefulness of these line monitoring devices.

In several line voltage monitoring devices in the prior art, bridge circuits are employed to detect the negative-sequence component of line voltage. Some of these circuits are limited to the utilization of passive networks of resistors and capacitors to detect a signal proportional to the negative-sequence voltage component, the object of these circuits being the elimination of inductive components. These circuits have either network configurations or impedance relationships which have been assumed on some unspecified basis other than the phase-shifting of particular signals. The devices in which these circuits are used will not prevent the starting of an electrical motor when voltage unbalance conditions are present on associated supply lines. These devices also rely on additional lockout circuits to prevent a motor from restarting after it has been disconnected due to voltage unbalance on its associated supply lines.

Other line monitoring devices employ negative-sequence current-sensing circuits. These current-sensing devices are less suitable for use in the industrial control environment because supply lines must be broken and current transformers installed therein as part of such devices. In comparison, voltage-sensing devices can usually be connected directly to the supply lines with common secondary distribution line voltages such as 208 volts, 240 volts or 480 volt. Another disadvantage of devices with current-sensing circuits is that, without added circuitry, such devices will not prevent a load from being connected under voltage unbalance conditions, because a current must be established for the operation of the current-sensing circuits.

The current-sensing devices of the prior art have employed operational amplifiers, sometimes for shifting the phase of certain currents, and sometimes for quite different purposes. Operational amplifiers can provide almost any desired phase shift, however, some phase shifts are easier to obtain than others, the easiest to obtain being a phase shift of 180°. While operational amplifiers can be used to advantage in negative-sequence component detection circuits, the devices of the prior art have employed them inefficiently and in excessive numbers.

SUMMARY OF THE INVENTION

The invented method includes the steps of imparting a preset phase shift of approximately 180° to a signal that is proportional to $V_a$, imparting a preset phase shift of approximately 60° to a signal that is proportional to $V_b$, and imparting a preset phase shift of approximately $-60°$ to a signal that is proportional to $V_c$, and summing the three phase-shifted signals to generate a negative-sequence signal that is proportional to the negative-sequence component of line voltage.

A general object of the invention is to simplify the phase-shifting networks required to obtain a negative-sequence component of a three-phase line voltage. The shifting of line voltage signals by 180°, $+60°$ and $-60°$, respectively, is advantageous due to the special nature of a 180° phase shift or inversion, and the reduction of the $\pm 120°$ phase shifts called for by the mathematical theory to $\pm 60°$ phase shifts, which are more easily obtained with passive filters. The cascading of filters to obtain these phase shifts is not necessary.

Another object of the invention is to provide a method of preventing the connection of a load to a voltage source in which a negative-sequence component is sensed. By requiring a positive output signal from a negative-sequence detection device to establish and maintain the closure of contacts between the source and the load under balanced voltage conditions, the load is prevented from being connected when unbalanced voltages inhibit such a positive signal.

Another object of the invention is to provide a high-impedance, low-power, line-monitoring circuit which can be directly connected to power lines with voltages greater than 600 volts. This high-impedance circuit provides an output control signal which switches a relay, but does not drive it, thereby requiring very little power. The circuit can be made in the form of a compact, hybrid microcircuit with thin-film resistive networks, and chip capacitors and amplifiers.

Another object of the invention is to provide an electronic control circuit which is extremely accurate, and which has both sensitivity levels and operating threshold levels which can be set quite precisely. An operational amplifier which sums the phase-shifted signals can be arranged with a feedback resistor and filtering capacitor to attenuate and filter out spurious signals received from the power lines. A comparator and time delay network can be set to respond only to a negative-sequence component of preselected magnitude which is received over a preselected time period, thereby preventing spurious signals from tripping a load disconnect device.

The foregoing and other objects and advantages of the invention will appear from the following description. In the description reference is made to the accompanying drawings which form a part hereof, and in which a preferred embodiment of the invention is shown. The preferred embodiment does not necessarily represent the full scope of the invention, however, and reference should be made to the claims herein for interpreting the scope of the invention.

BRIEF DESCRIPTION OF THE DRAWINGS

FIG. 3 is a phasor diagram of the symmetrical components of FIGS. 2b–2d summed to produce the vectors in FIG. 2a;

DESCRIPTION OF THE PREFERRED EMBODIMENT

Figure 1:
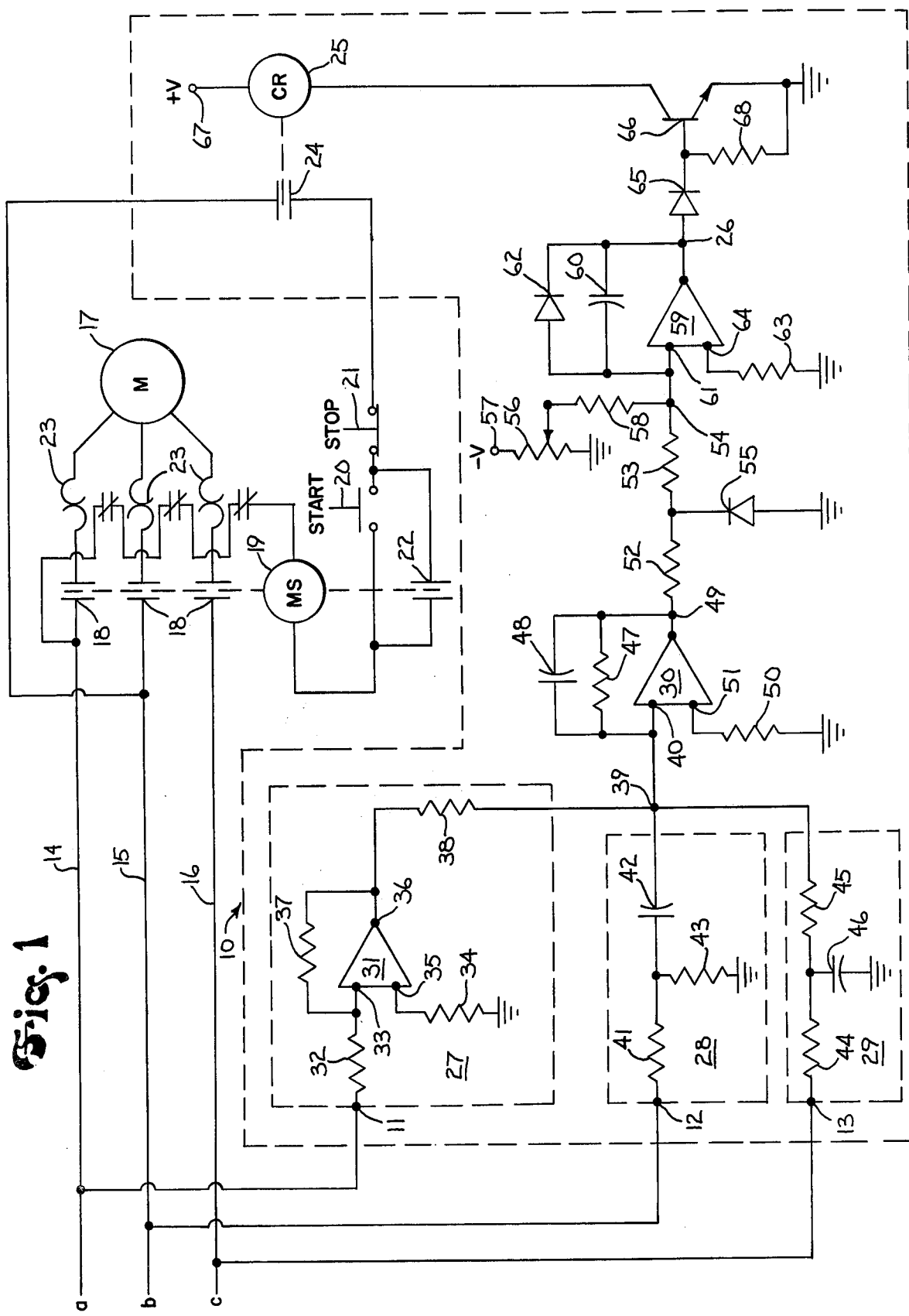
FIG. 1 is an electrical schematic diagram of a relay circuit which incorporates the present invention.

Referring to FIG. 1, a line voltage monitoring relay 10 that implements the present invention has three input terminals 11, 12 and 13, which are connected to three single-phase power lines 14, 15 and 16, respectively. The power lines 14, 15 and 16 are part of a three-phase power source having phases a, b and c to which a three-phase induction motor 17 is connected. The three power lines 14, 15 and 16 provide a three-phase A.C. voltage, which includes three line-to-line voltages. The three-phase A.C. voltage can also be resolved into three line-to-neutral voltages. Although there is not neutral line in FIG. 1, the apparatus of the present invention operates satisfactorily whether or not there is a neutral line in the three-phase supply line, and whether or not such a neutral line is grounded.

The method is performed with the line voltage monitoring relay 10, which is used to control the connection of the power source to the three-phase induction motor 17. The connection of the power source to the induction motor 17 is made through three pairs of main contacts 18, each pair of main contacts 18 being connected between a respective phase of the power source and the motor 17. The opening and closing of the main contacts 18 is controlled by a motor starting coil 19 which is connected in a circuit between two of the phase conductors, in this example between lines 14 and 15. The motor starting coil 19 and main contacts 18 are of the type disclosed in Lawrence, U.S. Pat. No. 3,134,869, issued May 26, 1964, in which the motor coil 19 is adapted to close the main contacts 18 upon its energization. A push button station includes a start push button 20 and a stop push button 21 that are connected in series with the motor starter control coil 19 and with one another. A pair of auxiliary contacts 22 such as disclosed in Freitag et al, U.S. Pat. No. 3,949,333, issued Apr. 6, 1976, are connected across the start push button 20.

When the start push button 20 is depressed the motor starting coil 19 is energized and the main contacts 18 are closed to apply power to the motor 17. The motor starting coil is also adapted to close the auxiliary contacts 22 upon its energization, so that when the start push button 20 is released and its continuity is broken, the motor starting circuit and the motor starting coil 19 will remain energized. Upon the depression of the stop button 21, the motor starting circuit including the motor starting coil 19 is deenergized, and the main contacts 18 are opened to cut off the power to the load. Also included in the motor starting circuit, in series with the motor starting coil 19, are three conventional thermal overload relays 23. Each overload relay 23 has an element which is connected in a respective line supplying power to the motor 17. Should excessive heat or current develop in any of the lines 14, 15 and 16, a pair of normally closed contacts in the overload relay 23 in that line will open, causing the motor starting coil 19 to be deenergized and the motor 17 to be disconnected from the power source.

The invention may best be explained by referring to the individual phase conductors and phase voltages in the notation which is well understood by those skilled in the art. Thus, power lines 14, 15 and 16 shall be referred to as conductors for phases a, b and c, respectively. The line-to-line voltage provided by phase a with respect to phase b shall be represented as $V_{ab}$. Similarly, the other line-to-line voltages shall be designated $V_{bc}$ and $V_{ca}$, respectively. The line-to-neutral voltages between each phase conductor and a neutral or an electrical ground shall be referred to as $V_a$, $V_b$ and $V_c$, respectively. The voltages referred to herein have both a magnitude and a phase angle, and can be depicted by vectors shown in polar coordinates as in FIGS. 2a–2d, 3 and 4. The phase sequence in the three-phase power source is positive or a-b-c, which means that with $V_a$ as a reference, $V_b$ has a phase angle that lags $V_a$, but leads $V_c$. Under normal conditions the phase difference between any pair of phase voltages is 120°, whether the voltages are measured between each pair of lines, or between each line and a grounded or ungrounded neutral.

Figure 2A:
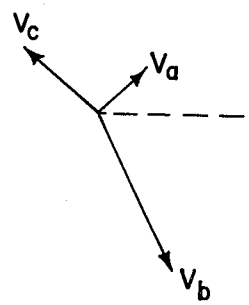
FIGS. 2a–2d are phasor diagrams which show the resolution of a three-phase voltage into symmetrical components.
Figure 2B:
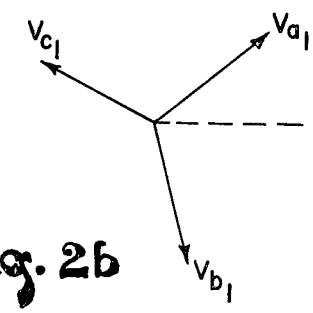
Figure 2C:
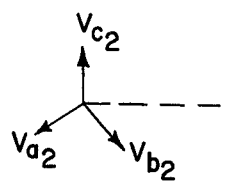
Figure 2D:
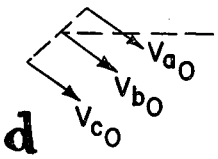

Referring to FIG. 2a an unbalanced three-phase voltage with single-phase voltages $V_a$, $V_b$ and $V_c$ is shown as it might appear at the input terminals 11, 12 and 13 of the line voltage monitoring relay 10. The theory of symmetrical components provides that this unbalanced system of voltages can be resolved into a balanced system of positive-sequence components, a balanced system of negative-sequence components, and a unitary system of zero-sequence components having the same phase and magnitude. The positive-sequence components of $V_a$, $V_b$ and $V_c$ are shown as $V_{a1}$, $V_{b1}$ and $V_{c1}$ in FIG. 2b, the negative-sequence components are shown as $V_{a2}$, $V_{b2}$ and $V_{c2}$ in FIG. 2c, and the zero-sequence components are shown as $V_{a0}$, $V_{b0}$ and $V_{c0}$ in FIG. 2d. Mathematically, the positive-sequence components can be expressed in terms of the original unbalanced voltages as follows:

$$V_{a1} = \tfrac{1}{3}(V_a + V_b \times 1\angle 120° + V_c \times 1\angle 240°) \quad (1)$$

$$V_{b1} = \tfrac{1}{3}(V_a \times 1\angle 240° + V_b + V_c \times 1\angle 120°) \quad (2)$$

$$V_{c1} = \tfrac{1}{3}(V_a \times 1\angle 120° + V_b \times 1\angle 240° + V_c) \quad (3)$$

Thus, for example, the positive-sequence component, $V_{a1}$, is a vector one-third the magnitude of [vector $V_a$ + vector $V_b$ (rotated through +120°) + vector $V_c$ (rotated through +240°)]. The negative-sequence components can be expressed with the following mathematical expressions:

$$V_{a2} = \tfrac{1}{3}(V_a + V_b \times 1\angle 240° + V_c \times 1\angle 120°) \quad (4)$$

$$V_{b2} = \tfrac{1}{3}(V_a \times 1\angle 120° + V_b + V_c \times 1\angle 240°) \quad (5)$$

$$V_{c2} = \tfrac{1}{3}(V_a \times 1\angle 240° + V_b \times 1\angle 120° + V_c) \quad (6)$$

And the zero-sequence components can be expressed with the following mathematical expressions:

$$V_{a0} = \tfrac{1}{3}(V_a + V_b + V_c) \quad (7)$$

$$V_{b0} = \tfrac{1}{3}(V_a + V_b + V_c) \quad (8)$$

$$V_{c0} = \tfrac{1}{3}(V_a + V_b + V_c) \quad (9)$$

Figure 3:
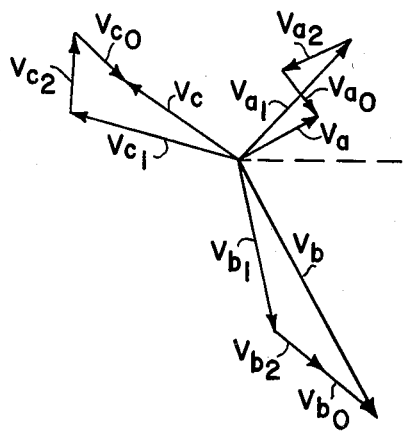

Referring to FIG. 3, the voltage components can be summed to produce the unbalanced voltages from which they were derived. Further information covering the derivation of these formulae can be obtained from standard electrical engineering texts, such as Kerchner and Corcoran, *Alternating-Current Circuits*, 4th ed., New York, John Wiley & Sons, Inc., 1962, pp. 489–496.

Because the negative-sequence components are equal it is necessary to measure only one of them to determine their magnitude. Therefore, $V_{a2}$ shall be analyzed in more detail. The first thing to notice is that $V_{a2}$ is the sum of three vectors, one of them being $V_a$. The other vectors are $V_b \times 1\angle 240°$, which is $V_b$ shifted in phase by 240°, and $V_c \times 1\angle 120°$, which is $V_c$ shifted in phase by 120°. The sum of the vectors is multiplied by a factor of one-third to obtain the appropriate magnitude.

Figure 4:
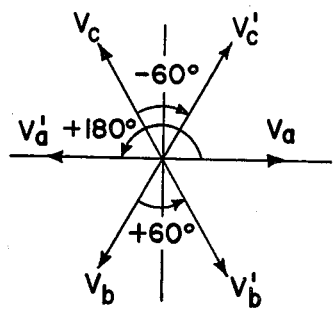
FIG. 4 is a phasor diagram of the phase shifts which are imparted on a three-phase voltage by the circuit of FIG. 1.
Figure 5:
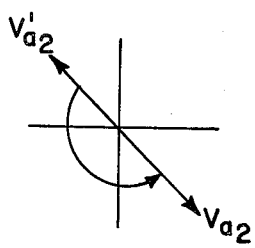
FIG. 5 is a phasor diagram showing the inversion of the sum of the three-phase shifted voltages which is carried out in the circuit of FIG. 1.

By inverting $V_a$, or shifting its phase 180°, as shown in FIG. 4, the magnitude of the other phase shifts to be made can be reduced from 120° to 60°. By shifting $V_b$ 60°, and by shifting $V_c$ −60°, a negative-sequence set of vectors $V_a'$, $V_c'$ and $V_b'$ is established. If these vectors are balanced, thereby representing balanced line voltages, their sum will be zero. If the line voltages are unbalanced, a negative-sequence component $V_{a2}'$ results as seen in FIG. 5. The phase of the sum $V_{a2}'$ is displaced 180° from its ordinary phase angle, and this is permissible as it is the magnitude of $V_{a2}'$ that determines the magnitude of the negative-sequence signal. Nevertheless, in the circuit of the present invention this component is shifted by 180° with an operational amplifier to obtain its normal phase angle at the same time as the negative-sequence vectors, $V_a'$, $V_c'$ and $V_b'$, are being summed.

After the negative-sequence component is detected it can be used to control the connection of a load to a power source. This can be accomplished with a control signal. It is desired that a control signal be established in the absence of a fault condition. This allows the control signal to positively signal that the load is to be connected to the power source under satisfactory conditions. The absence of a control signal will prevent the connection of the load by preventing the energization of a load control circuit. If the load has been connected, the loss of the control signal due to voltage unbalance will result in the deenergization of this load control circuit. The response of the control signal to voltage unbalance occurs over a time delay period to prevent spurious signals from causing unnecessary interruptions. It is also desired that any control circuit be tolerant to a preselected amount of voltage unbalance that will not adversely affect the load in a substantial manner. This can be accomplished by comparing the negative-sequence signal to a reference signal and making the control signal responsive to the net result of this comparison.

This method is carried out with the line voltage monitoring relay 10 of the present invention, which includes a conventional control relay, having a pair of normally open contacts 24 connected serially in the motor starting circuit, and a coil 25 which is adapted to close these contacts 24 upon its energization. The relay coil 25 is, in turn, controlled by a solid-state, electronic circuit, which is connected to the power lines 14, 15 and 16 at its input terminals 11, 12 and 13, and which generates an output signal at an output terminal 26 to control the energization and deenergization of the relay coil 25.

A first stage of the electronic circuit generates a signal which is proportional to the negative-sequence component of the three-phase line voltage provided by the power source. This signal shall be referred to as the negative-sequence signal. This portion of the circuit includes three phase-shifting, filter networks 27, 28 and 29, which are connected to the circuit input terminals 11, 12 and 13, respectively, and a summing operational amplifier 30 that sums the output signals generated by the phase-shifting networks 27-29 to provide the negative-sequence signal.

The first phase-shifting network 27 includes an operational amplifier 31 that functions as a phase inverter. A coupling resistor 32 is connected between the circuit input terminal 11 that receives $V_a$ and the inverting input terminal 33 on the operational amplifier 31. A biasing resistor 34 is connected between the non-inverting terminal 35 of the operational amplifier 31 and an internal circuit ground to stabilize the amplifier 31 and minimize the effects of D.C. bias currents encountered in such amplifiers. The A.C. signal at the output terminal 36 of the inverting amplifier 31 is controlled by the A.C. signal at the inverting input terminal 33. A feedback resistor 37 is connected between the output terminal 36 and the inverting input terminal 33 of the inverting amplifier 31 to control the gain and sensitivity of the amplifier 31. A second coupling resistor 38 is connected between the output terminal 36 of the inverting amplifier 31 and a summing node 39, which is also connected to an inverting input terminal 40 on the summing operational amplifier 30. The first phase-shifting network produces a current at the summing node 39 which is proportional to $V_a$ and which shifted in phase by 180° from $V_a$. A scale factor between this current and $V_a$ is determined by the gain of the amplifier and the magnitude of the second coupling resistor 38.

The second phase-shifting network 28 is a T-section filter with passive elements. A first resistor 41 and a capacitor 42 are connected in series between the circuit input terminal 12 that receives $V_b$ and the summing node 39. A shunt resistor 43 is connected between a junction point intermediate the series resistor 41 and the capacitor 42, and the circuit ground. The circuit ground is isolated from the neutral or ground in the power source, however, it still provides a reference for the line voltages received at the circuit input terminals 11, 12 and 13 so that the line voltages are line-to-neutral voltages when applied to the phase-shifting networks 27-29. With $V_b$ applied to the second input terminal 12, a current that is shifted by 60° in the positive or leading direction from $V_b$ flows into the summing node 39 from the second phase-shifting network 28.

The third phase-shifting network 29 is also a T-section, passive filter, but with different impedances in its respective branches than the second phase-shifting network 28. A pair of resistors 44, 45 are connected in series between the corresponding input terminal 13 and the summing node 39. A shunt capacitor 46 is connected between a junction point intermediate the two resistors 44, 45, and the circuit ground. With $V_c$ applied at the filter input terminal 13, a current that is shifted in phase by 60° in the negative or lagging direction from $V_c$ flows into the summing node 39 from the third phase-shifting network 29.

The overall impedances of the two passive phase-shifting networks 28, 29 are adjusted with the gain of the active phase-shifting network 27 so that the magnitudes of the currents flowing into the summing node 39 will be equal when the line voltages are balanced. The phases of these currents will, of course, vary by 120°, and their sum will be zero. The impedances of the two passive networks 28, 29 are preferably on the order of 4 megohms to enable the circuit to be directly connected to power lines and yet draw very little current. The values of the individual components in the passive networks 28, 29 are dependent upon the level of signal or gain desired, the line voltage and the frequency of operation, which is preferably 60 hertz. Some nominal line voltages for which these values can be calculated are 208 volts, 240 volts, 480 volts and 600 volts. With components of the proper value, the circuit can also be used with higher line voltages. Having chosen the circuit parameters, one skilled in the art can calculate the values for the components for the passive networks 28, 29.

The summing operational amplifier 30 receives the combined output signals of the phase-shifting networks 27-29 at its inverting input terminal 40, which is connected to the summing node 39. A feedback resistor 47 and a filtering capacitor 48 are connected in parallel between the inverting input terminal 40 and an output terminal 49 on the summing amplifier 30. A biasing resistor 50 is connected between the noninverting input terminal 51 of the summing amplifier 30 and the circuit ground to stabilize the amplifier 30 and minimize the effects of D.C. bias currents at the input terminals 40, 51.

When a signal is present at the summing node 39, current flows from the node 39 through the feedback resistor 47 to establish an output voltage at an output terminal 49 of the summing amplifier 30. This output voltage is the sum of the three line voltages $V_a$, $V_b$ and $V_c$, shifted in phase by 180°, +60°, and −60°, respectively. As shown by the mathematical analysis, this sum is a negative-sequence component of the three-phase voltage, adjusted in proportion to the gain of the phase-shifting and summing networks. The sum of the phase-shifted signals is inverted at the same time as the signals are combined, thus imparting the proper phase angle to the negative-sequence component as shown in FIG. 5. When the voltages in the power lines 14-16 of FIG. 1 are balanced, no signal will be transmitted from the summing node 39 to the summing amplifier 30. Therefore, no negative-sequence signal will be generated at its output terminal 49. The feedback resistor 47 provides a means to adjust the gain and sensitivity of the summing amplifier 30, while the capacitor 48 provides filtering for harmonic frequency components.

A second stage of the electronic circuit in the line monitoring relay 10 of FIG. 1 provides a half-wave rectifier for rectifying the A.C. signal generated at the output terminal 49 of the summing amplifier 30. The rectifier includes two resistors 52, 53 connected in series between the output terminal 49 of the summing amplifier 30 and an input terminal 54 to a comparator and time delay network. A diode 55 has its cathode connected to a junction point between these two resistors 52, 53 and its anode connected to the circuit ground. In this position the diode 55 rectifies the A.C. signal, allowing only the positive portion to be conducted through the second resistor 53 to the comparator and time delay stage of the circuit.

The comparator and time delay network includes a variable resistor 56, which can be a potentiometer or trimmer. The variable resistor 56 has a resistive element connected between a source 57 of negative supply voltage and the circuit ground, and a wiper connected to the comparator input terminal 54 through a resistor 58. The negative voltage source 57 generates a current through the resistor 58 connected to the wiper, and this current is compared at the comparator input terminal 54 with the positive current received from the rectifier through its second resistor 53. The time delay portion of the network is formed by an operational amplifier 59 and a capacitor 60 with a positive plate connected to the output terminal 26 of the operational amplifier 59 and a negative plate connected to the inverting input terminal 61 of the operational amplifier 59. This arrangement of an operational amplifier 59 and a capacitor 60 is sometimes referred to as an operational integrator because the voltage at the output terminal 26 of the amplifier 59 will be the integral of the voltage at the inverting input terminal 61. A diode 62 is connected in parallel to the capacitor 60, with its cathode connected to the output terminal 26 of the operational amplifier 59 and its anode connected to the inverting input terminal 61 of the operational amplifier 59. The operational amplifier 59 has a biasing resistor 63 connected between its noninverting input terminal 64 and the circuit ground to minimize the effects of input bias currents at the input terminals 61, 64.

The output terminal 26 of the comparator and time delay network is connected to an amplifier driven relay. More particularly, the output terminal 26 is connected to the anode of a diode 65, which is included in a biasing network for an NPN transistor 66 that controls the energization and deenergization of the relay coil 25. This diode 65 has its cathode connected to the base of the transistor 66. The transistor 66 has its collector connected to one side of the relay coil 25 and its emitter connected to ground. A source 67 of positive supply voltage is connected to the other side of the relay coil 25. A biasing resistor 68 is connected between the base and emitter of the transistor 66. The transistor 66 provides a solid state switch and an amplifier for controlling the energization and deenergization of an electromechanical switch, the relay.

To explain the operation of the monitoring relay 10, an initial condition shall be assumed in which the voltage at the output terminal 26 of the operational amplifier 59 is zero, the transistor 66 is in a nonconducting state, and the relay coil 25 is deenergized. Still referring to FIG. 1, the voltage sources 57, 67 are derived from the power lines 14, 15 and 16 to which the line voltage monitoring relay 10 is connected. Under balanced voltage conditions, the negative voltage source 57 provides a reference current signal at the input terminal 54 of the comparator, but there is no negative-sequence signal received at that terminal 54. Therefore, the net signal applied at the input terminal 61 of the operational amplifier 59 has a negative value. Under these conditions the feedback capacitor 60 is charged and the operational amplifier 59 is driven to positive saturation. The voltage response at the output terminal 26 of the operational amplifier 59 is shown in FIG. 6.

Figure 6:
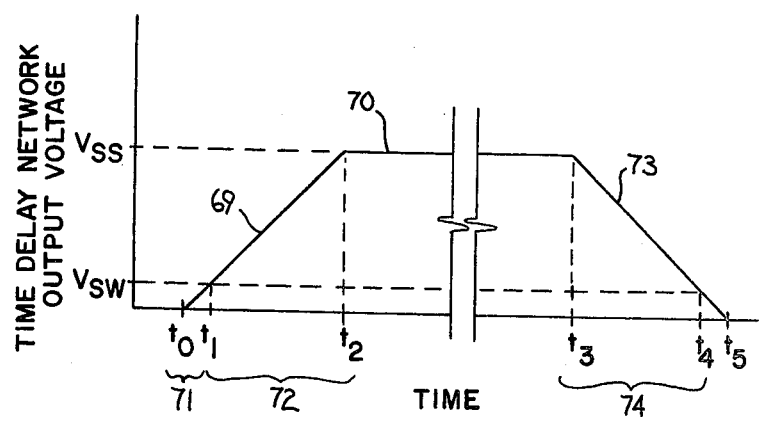
FIG. 6 is a graph showing a voltage generated in the circuit of FIG. 1, as a function of time.

As the capacitor 60 charges, the voltage at the output terminal 26 approximates an increasing ramp function represented by the first portion 69 of the response curve in FIG. 6. From time $t_0$, when the initial condition was present, to time $t_1$, the voltage rises to a switching level value, $V_{sw}$, which forward biases the base-emitter junction of the transistor 66 by providing sufficient current through the diode 65 and the biasing resistor 68. This switches the transistor 66 to its conducting state, allowing the relay coil 25 to be energized, and further allowing the motor 17 to be connected to the power lines 14-16. Thus, the switching of the transistor 66 can be controlled with a low level control signal, $V_{sw}$, at the output terminal 26 of the time delay network. The voltage at the output terminal 26 continues to rise until it reaches a steady-state value, $V_{ss}$, upon saturation of the operational amplifier 59. This value is maintained during a steady-state operation as shown by the second portion 70 of the response curve in FIG. 6. The reset time interval 71 between $t_0$ and $t_1$ that is required to switch the transistor 66 is relatively short compared to the reset time interval 72 between $t_1$ and $t_2$ that is required to reset the operational amplifier 59 for steady-state operation. As a result, the resetting of the time delay network does not unnecessarily delay the connection of the motor 17 to the power source.

Still referring to FIGS. 1 and 6, the voltage at the output terminal 26 will remain at its steady-state value over the operating time interval between $t_2$ and $t_3$. The steady-state signal will maintain the transistor 66 in its conducting state, which will maintain the actuation of the relay switch contacts 24. It shall next be assumed that an unbalanced voltage condition occurs at time $t_3$. Upon this event, a net positive signal will be generated at the input terminal 61 of the operational amplifier 59. The capacitor 60 across the operational amplifier 59 will then discharge to produce a voltage at the output terminal 26 that approximates a decreasing ramp function. This function is represented by the third portion 73 of the response curve in FIG. 6. When the output voltage drops below the switching level value, $V_{sw}$, the control signal is lost, the transistor 66 is turned off, the relay coil 25 is deenergized, and the relay contacts 24 are opened. This sequence causes deenergization of the motor starting coil 19 and the opening of the main contacts 18 to interrupt the connection of the motor 17 to the power source. The time interval 74 between $t_3$ and $t_4$ represents the time dalay provided by the time delay network. The output voltage may continue to decrease to zero at time $t_5$, but it will not become negative due to the diode 62 connected across the operational amplifier 59. The diode 62 prevents the output voltage from going negative, thereby protecting the capacitor 60, which is preferably an electrolytic capacitor.

Once the motor 17 has been disconnected as a result of the unbalanced voltage condition, it will be necessary to manually restart the motor 17 by manually operating the start push button 20. If the same unbalanced voltage condition is still present, the motor 17 will not be reconnected to the power source because an output signal equal to the switching level voltage, $V_{sw}$, will not be established at the output terminal 26 of the operational amplifier 59. From this description, it is also apparent that the motor 17 cannot be connected to the power source in the first instance if an intolerable voltage unbalance condition exists as determined by the comparator.

Preferably, the motor 17 should be disconnected from the power source when the negative-sequence component is between 2% and 7% of rated line voltage. Less than 2% voltage unbalance is usually tolerable while greater than 7% of voltage unbalance will probably cause undesirable heating in the motor 17. Within this range of voltage unbalance, the time delay network will trip the relay over different time intervals, depending on the comparator setting and the magnitude of the negative-sequence signal received at the comparator input terminal 54. The comparator is adjusted by adjusting the variable resistor 56 in increments which correspond to percentages of rated line voltage. With the variable resistor 56 set to conduct a reference current corresponding to 4% of rated line voltage, the time delay network will respond to trip the relay in 7.0 seconds with 4.5% negative-sequence component, 3.5 seconds with 5.5% negative-sequence component, 2.5 seconds with 6.0% negative-sequence component, and 1.0 second if a line is completely lost. The threshold can be set within one-half of 1% of rated line voltage, however, the trip point can vary by ±1%. The slopes of the ramp portions 69, 73 of the response curve in FIG. 6 are average slopes which would vary for different comparator settings or for different amounts of negative-sequence signal.

This, a method and means have been described for detecting the negative-sequence component of line voltage in the three-phase power source, and controlling the connection of a load to the source. The monitoring means not only monitors loads on-line, but it controls the initial connection of a load to the power source. The circuit employed in the monitoring means is a high-impedance, low-power circuit that is readily adapted to microcircuit manufacturing techniques. The circuit can be adjusted in both its sensitivity and its operating limits. The circuit provides filtering in several stages. The circuit can be directly connected to the lines of common distribution power sources, with some embodiments being capable of direct connection to power sources with line voltages greater than 600 volts.

I claim:

1. A method of monitoring open phase, phase reversal and voltage unbalance conditions in both wye-connected and delta-connected polyphase power sources having first, second and third phased voltage signals, $V_a$, $V_b$ and $V_c$, respectively, in preselected phase sequence a-b-c, comprising the steps of:
   imparting a preset phase shift of approximately 180° to a signal that is proportional to $V_a$;
   imparting a preset phase shift of approximately 60° to a signal that is proportional to $V_b$;
   imparting a preset phase shift of approximately −60° to a signal that is proportional to $V_c$; and summing the three phase-shifted signals to generate a negative-sequence signal that is proportional to the negative-sequence component of the three-phase line voltage.

2. A circuit for monitoring open phase, phase reversal, and voltage unbalance conditions in both wye-connected and delta-connected three-phase power sources having first, second and third phase conductors carrying phased voltages $V_a$, $V_b$ and $V_c$, respectively, in preselected phase sequence a-b-c, the circuit comprising:
   first phase-shifting means, adapted to be connected to the first phase conductor, for shifting the phase of a signal that is proportional to $V_a$ approximately 180°;
   second phase-shifting means, adapted to be connected to the second phase conductor, for shifting the phase of a signal that is proportional to $V_b$ approximately 60°;
   third phase-shifting means, adapted to be connected to the third phase conductor, for shifting the phase of a signal that is proportional to $V_c$ approximately −60°; and
   summing means, connected to the first, second and third phase-shifting means to receive the phase-shifted signals, for generating a negative-sequence signal in response to the phase-shifted signals that is proportional to the negative-sequence component of voltage in the three-phase power source.

3. In a circuit for controlling the connection of a load to either a wye-connected or a delta-connected three-phase voltage source having first, second and third phase conductors carrying phased voltages $V_a$, $V_b$ and $V_c$, respectively, which are normally in phase sequence a-b-c, the combination comprising:
   a first phase-shifting network adapted to be connected to the first phase conductor, and adapted to impart a preset phase shift of approximately 180° to a signal that is proportional to $V_a$;
   a second phase-shifting network, adapted to be connected to the second phase conductor, and adapted to impart a preset phase shift of approximately 60° to a signal that is proportional to $V_b$;
   a third phase-shifting network, adapted to be connected to the third phase conductor, and adapted to impart a preset phase shift of approximately −60° to a signal that is proportional to $V_c$;
   a summer having an input and an output, the input being connected to the first, second and third phase-shifting networks to receive the phase-shifted signals, the summer being operable to combine the phase-shifted signals and generate a negative-sequence signal at its output that is proportional to the negative-sequence component of line voltage in the three-phase power source.

4. A negative-sequence component detection circuit for connection to both wye-connected and delta-connected power sources, the circuit comprising:
   a first phase-shifting network that includes a first phase-inverting, operational amplifier having an inverting input and output, a first coupling resistance connected to the inverting amplifier input, a second coupling resistance connected to the amplifier output, and a feedback resistance connected between the inverting amplifier input and the amplifier output;
   a second phase-shifting network that includes a first resistance and a capacitance connected in series, and a second resistance connected between a junction intermediate the first resistance and the capacitance, and a circuit ground, the values of the resistances and the capacitance in the second network being selected to provide a phase shift of +60°:
   a third phase-shifting network that includes first and second resistances connected in series, and a capacitance connected between a junction intermediate the first and second series resistances, and the circuit ground, the values of the resistances and capacitance in the third network being selected to provide a phase shift of −60°; and a summing network that includes a second operational amplifier having an inverting input and an output, the input being connected a common junction to the second coupling resistance in the first network, to the capacitance in the second network, and to the second series resistance in the third network, the summing network also having a feedback resistance connected between its inverting input and its output.

5. The circuit of claim 4 further comprising a comparator and time delay network that includes a comparator input connected to receive a signal from the output of the second operational amplifier, a variable resistance adapted to be connected to a reference voltage source and having a wiper connected to the comparator input, a third operational amplifier having an inverting input connected to the comparator input and having an output, and a feedback capacitance connected between the inverting input and the output of the third amplifier.

* * * * *

UNITED STATES PATENT AND TRADEMARK OFFICE
CERTIFICATE OF CORRECTION

PATENT NO. : 4,210,948

DATED : July 1, 1980

INVENTOR(S) : Richard W. Waltz

It is certified that error appears in the above—identified patent and that said Letters Patent is hereby corrected as shown below:

Col. 1, line 40, the word "unbalanced" should be underlined or italicized.

Col. 1, line 42, the word "balanced" should be underlined or italicized.

Col. 1, line 43, the word "balanced" should be underlined or italicized.

Col. 2, line 63, after the numeral 480, the word "volt" should be --volts--.

Col. 4, line 36, the word "not" should be --no--.

Col. 5, line 42, the word "unbalanced" should be underlined or italicized.

Col. 5, line 43, the word "balanced" should be underlined or italicized.

Col. 5, line 44, the word "balanced" should be underlined or italicized.

Col. 6, line 12, the equation "$V_{c0}=1/3\ (V_a+V_b+V_c)$" should be of the same size and margin as the equations in col. 6, lines 9 and 11.

UNITED STATES PATENT AND TRADEMARK OFFICE
CERTIFICATE OF CORRECTION

PATENT NO. : 4,210,948

DATED : July 1, 1980

INVENTOR(S) : Richard W. Waltz

It is certified that error appears in the above—identified patent and that said Letters Patent is hereby corrected as shown below:

Col. 11, line 29, the word "This" should be --Thus--.

Signed and Sealed this

Seventh Day of October 1980

[SEAL]

Attest:

SIDNEY A. DIAMOND

Attesting Officer

Commissioner of Patents and Trademarks